(12) United States Patent
Corrion et al.

(10) Patent No.: US 9,202,880 B1
(45) Date of Patent: Dec. 1, 2015

(54) ETCH-BASED FABRICATION PROCESS FOR STEPPED FIELD-PLATE WIDE-BANDGAP

(71) Applicant: HRL LABORATORIES, LLC., Malibu, CA (US)

(72) Inventors: Andrea Corrion, Oak Park, CA (US); Keisuke Shinohara, Thousand Oaks, CA (US); Miroslav Micovic, Thousand Oaks, CA (US); Rongming Chu, Newbury Park, CA (US); David F. Brown, Woodland Hills, CA (US); Adam J. Williams, Los Alamitos, CA (US); Dean C. Regan, Simi Valley, CA (US); Joel C. Wong, Los Angeles, CA (US)

(73) Assignee: HRL Laboratories, LLC, Malibu, CA (US)

(*) Notice: Subject to any disclaimer, the term of this patent is extended or adjusted under 35 U.S.C. 154(b) by 134 days.

(21) Appl. No.: 14/014,930

(22) Filed: Aug. 30, 2013

Related U.S. Application Data

(60) Provisional application No. 61/814,981, filed on Apr. 23, 2013.

(51) Int. Cl.
 *H01L 29/20* (2006.01)
 *H01L 29/40* (2006.01)
 *H01L 21/765* (2006.01)
 *H01L 21/285* (2006.01)

(52) U.S. Cl.
 CPC ........ *H01L 29/402* (2013.01); *H01L 21/28587* (2013.01); *H01L 21/765* (2013.01); *H01L 29/2003* (2013.01)

(58) Field of Classification Search
None
See application file for complete search history.

(56) References Cited

U.S. PATENT DOCUMENTS

| 7,501,669 | B2 | 3/2009 | Parikh et al. | |
|---|---|---|---|---|
| 2001/0046759 | A1* | 11/2001 | Sakura | 438/573 |
| 2006/0043416 | A1* | 3/2006 | Li et al. | 257/192 |
| 2008/0020540 | A1* | 1/2008 | Takeda et al. | 438/393 |
| 2009/0267116 | A1 | 10/2009 | Wu et al. | |
| 2011/0049526 | A1* | 3/2011 | Chu et al. | 257/76 |

OTHER PUBLICATIONS

Y.F. Wu et al., "30-W/mm GaN HEMTs by Field Plate Optimization", IEEE Electron Device Letters, vol. 25, No. 3 (2004).
Saito et al., "High Breakdown Voltage ALGaN-GaN Power-HEMT Design and High Current Density Switching Behavior", IEEE Transactions on Electronic Devices, vol. 50, No. 12 (2003).
Y. Dora et al., "High Breakdown Voltage Achieved on ALGaN/GaN HEMTs With Integrated Slant Field Plates", IEEE Electron Device Letters, vol. 27, No. 9 (2006).

(Continued)

*Primary Examiner* — Khaja Ahmad
(74) *Attorney, Agent, or Firm* — Ladas & Parry

(57) ABSTRACT

A method of making a stepped field gate for an FET including forming a first set of layers having a passivation layer on a barrier layer of the FET and a first etch stop layer over the first passivation layer, forming additional sets of layers having alternating passivation layer and etch stop layers, successively removing portions of each set of layers using lithography and reactive ion etching to form stepped passivation layers and a gate foot, applying a mask having an opening defining an extent of a stepped field-plate gate, and forming the stepped field plate gate and the gate foot by plating through the opening in the mask.

16 Claims, 5 Drawing Sheets

(56) References Cited

OTHER PUBLICATIONS

H. Xing et al., "High Breakdown Voltage Achieved on ALGaN/GaN HEMTs Achieved by Multiple Field Plates", IEEE Electron Device Letters, vol. 25, No. 4 (2004).

From U.S. Appl. No. 14/014,915, Application & Office Actions.
From U.S. Appl. No. 14/014,915 (unpublished; non-publication requested), Restriction Requirement mailed on Feb. 25, 2015.

* cited by examiner

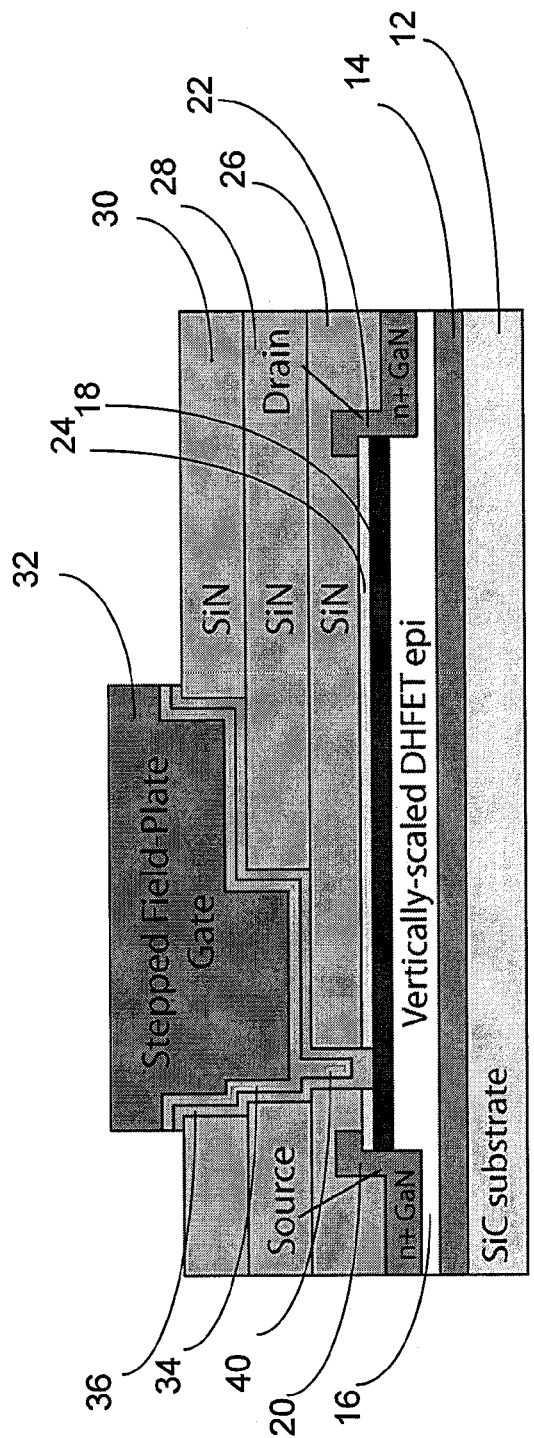
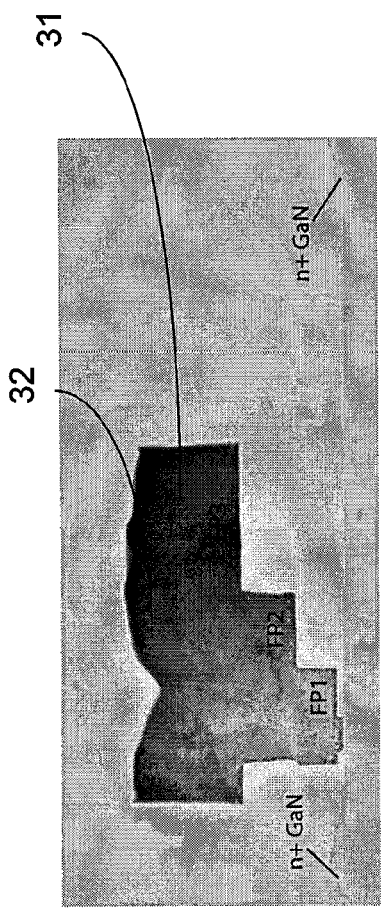
FIG. 1A
FIG. 1B

US 9,202,880 B1

ETCH-BASED FABRICATION PROCESS FOR STEPPED FIELD-PLATE WIDE-BANDGAP

CROSS REFERENCE TO RELATED APPLICATIONS

This application is related to and claims the benefit of U.S. Provisional Application No. 61/814,981, filed Apr. 23, 2013, which is incorporated herein as though set forth in full.

STATEMENT REGARDING FEDERAL FUNDING

This invention was made under U.S. Government contract DARPA FA8650-11-C-7181. The U.S. Government has certain rights in this invention.

TECHNICAL FIELD

This disclosure relates to field plates for transistors, and in particular to stepped field plates.

BACKGROUND

It is well-known that a peak in the electric field at the drain edge of the gate contact can limit the breakdown voltage of field effect transistors (FETs). In GaN FETs, the high electric fields in this region also commonly result in electron trapping at surface states and/or in the buffer, barrier, or passivation layers of the device, resulting in a virtual gate and reducing the on-state current of the device during high-voltage dynamic operation (known as "current collapse" or increased dynamic on-resistance). These issues can be mitigated through the use of field plates, which distribute the electric field over a larger area in the gate-drain region of the device, therefore reducing the peak field intensity.

In the prior art high-voltage GaN devices have typically utilized either a gate with a single field plate or multiple gate or source connected field plates separated by supporting dielectric layers, requiring multiple metallization steps during processing.

Y. F. Wu et al. describe in "30-W/mm GaN HEMTs by Field Plate Optimization", IEEE Electron Device Letters, Vol. 25, No. 3 (2004), a single gate-connected field-plate FET. The disadvantages of this approach include a non-optimum electric field profile due to having only a single field plate, and a requirement for multiple metallization steps.

Saito et al. describe in "High Breakdown Voltage AlGaN—GaN Power-HEMT Design and High Current Density Switching Behavior", IEEE Transactions on Electronic Devices, Vol. 50, No. 12 (2003) a single source-connected field plate FET. Field plate design and optimization are limited in this approach due to the single field-plate and discontinuity between gate and field-plate, resulting in a non-optimal electric field profile.

Y. Dora et al. describe in "High Breakdown Voltage Achieved on AlGaN/GaN HEMTs With Integrated Slant Field Plates", IEEE Electron Device Letters, Vol. 27, No. 9 (2006) a slanted gate field plate to reduce the peak electric field in the device. The disadvantages of this approach include a symmetric gate profile, which increases parasitic Cgs and limits the source-gate spacing, and poor process control over slant gate angle and gate length.

H. Xing et al. describe in "High Breakdown Voltage AlGaN—GaN HEMTs Achieved by Multiple Field Plates", IEEE Electron Device Letters, Vol. 25, No. 4 (2004) a multiple gate-connected field plate structure. The disadvantages of this approach include separation between the field plates by supporting dielectric layers, which limits field plate design and results in non-optimum electric field profile, multiple metallization steps, and non-plated gate and field plates.

Wu et al. describe in "Wide bandgap transistors with multiple field plates", U.S. Published Patent Application 2009/0267116 several multiple-field-plate GaN FET designs with gate and source-connected field plates separated by supporting dielectric layers. The disadvantages of these approaches include a separation between the field plates by supporting dielectric layers, which limits field plate design and results in non-optimum electric field profile, multiple metallization steps, and non-plated gate and field plates.

Parikh et al. describe in "Wide bandgap transistor devices with field plates" U.S. Pat. No. 7,501,669 issued Mar. 10, 2009, a stepped gate field-plate structure, as shown in FIG. 7 of the patent. However Parikh does not describe a method of fabrication.

What is needed is a stepped field plate for a field-effect transistor and method of making the stepped field plate that does not have the disadvantages of the prior art. The embodiments of the present disclosure answer these and other needs.

SUMMARY

In a first embodiment disclosed herein, a method of making a stepped field gate for an FET comprises forming a first set of layers having a first passivation layer on a barrier layer of the FET and a first etch stop layer over the first passivation layer, forming additional sets of layers having alternating passivation layer and etch stop layers, successively removing portions of each set of layers using lithography and reactive ion etching to form stepped passivation layers and a gate foot, applying a mask having an opening defining an extent of a stepped field-plate gate, and forming the stepped field plate gate and the gate foot by plating through the opening in the mask.

In another embodiment disclosed herein, a method of making a stepped field-plate gate field effect transistor comprises forming a first passivation layer on a barrier layer of the field effect transistor, forming a first etch stop layer over the first passivation layer, forming a second passivation layer on the first etch stop layer, forming a second etch stop layer over the second passivation layer, forming a third passivation layer on the second etch stop layer, removing a portion of the third passivation layer and the second etch stop layer by using lithography and reactive ion etching, removing a portion of the second passivation layer and the first etch stop layer by using lithography and reactive ion etching, removing a portion of the first passivation layer by using lithography and reactive ion etching to form an opening for a gate foot, applying a mask having an opening defining an extent of a stepped field-plate gate, and forming the stepped field plate gate and the gate foot by plating through the opening in the mask.

In still yet another embodiment disclosed herein, a method of making a stepped field-plate gate field effect transistor comprises growing a buffer layer on a substrate, a channel layer on the buffer layer, and a barrier layer on the channel layer, forming first and second ohmic contacts to the channel layer for a source and a drain, forming a first passivation layer on the barrier layer and the ohmic contacts, etching portions of the first passivation layer, the first and second ohmic contacts, the channel layer and the buffer layer to form a mesa for device isolation, implanting ions in etched regions surrounding the mesa for further device isolation, forming a first etch stop layer over the first passivation layer and the first and second ohmic contacts, forming a second passivation layer over the first etch stop layer, forming a second etch stop layer over the second passivation layer, forming a third passivation layer over the second etch stop layer, using lithography to apply resist having an opening and evaporating metal through the opening in the resist to form a metal field plate to define a source-side for a stepped field plate gate, removing portions of the metal field plate, the third passivation layer and the second etch stop layer by using lithography and reactive ion etching, removing a portion of the second passivation layer and the first etch stop layer by using lithography and reactive ion etching, removing a portion of the first passivation layer by using lithography and reactive ion etching to form an opening for a gate foot, depositing a seed layer by atomic layer deposition (ALD), applying a mask having an opening to define an extent of a stepped field-plate gate, forming the stepped field plate gate and the gate foot by plating through the opening in the mask, removing the mask, removing a portion of the seed layer that is not under the stepped field plate gate by ion milling, depositing a SiN layer, etching portions of the SiN layer, the first passivation layer, the second passivation layer, and the third passivation layer to expose the first and second ohmic contacts, depositing a third ohmic contact on the first ohmic contact, and a fourth ohmic contact on the second ohmic contact, and depositing overlay metal on the third and fourth contacts to form a source and a drain contact, respectively.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 1A shows a cross-sectional schematic of a multiple stepped field-plate GaN FET in accordance with the present disclosure, and FIG. 1B shows a cross-sectional TEM image of a fabricated multiple stepped field-plate GaN FET in accordance with the present disclosure;

DETAILED DESCRIPTION

Figure 2:
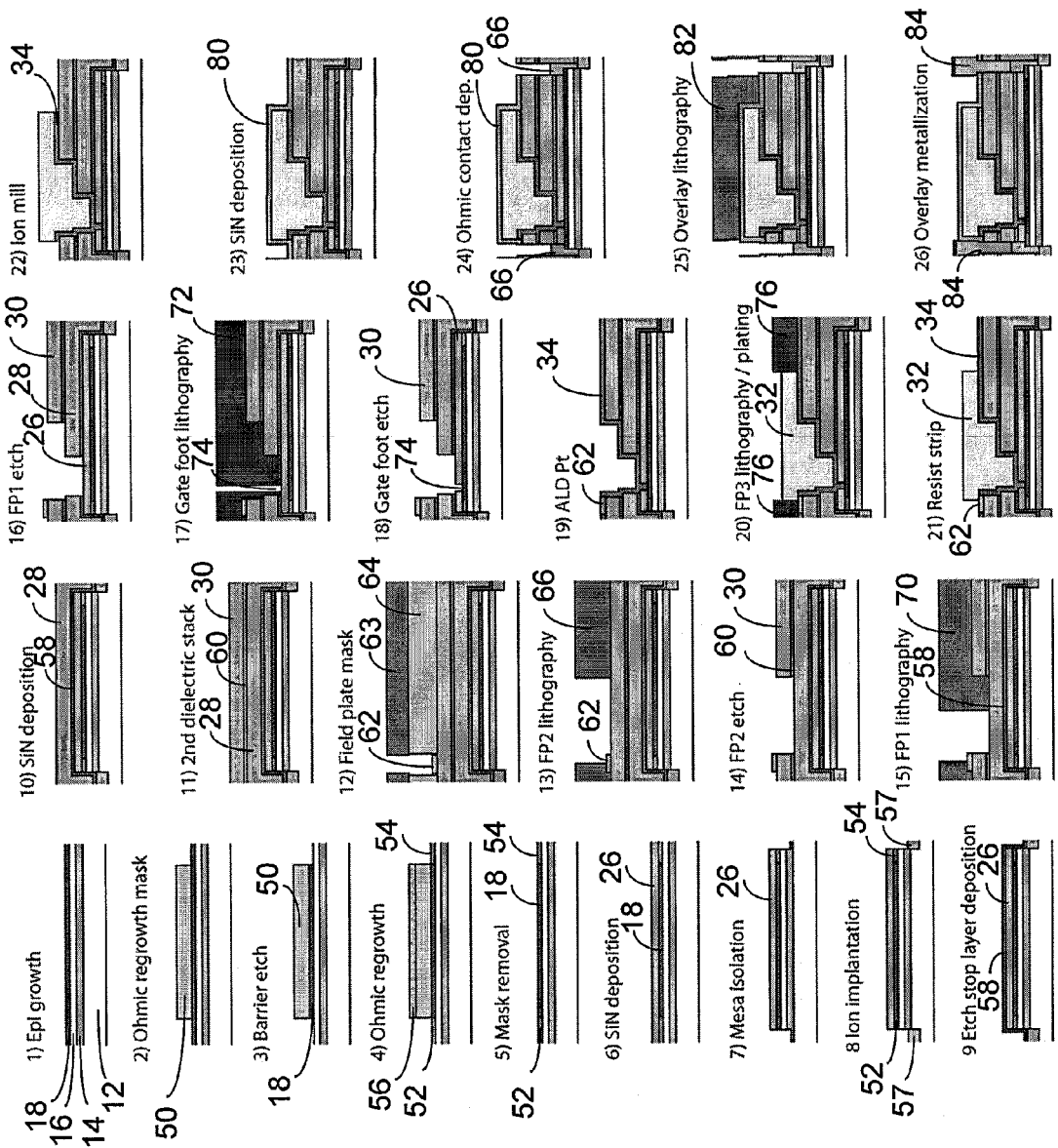
FIG. 2 shows a stepped field-plate gate fabrication process flow in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

This disclosure describes an etch-based method of fabricating a stepped field plate gate on a GaN heterojunction field-effect transistor (HFET) to reduce the peak electric field in the device, thereby increasing breakdown voltage and decreasing charge trapping. The fabrication method utilized in this invention results in excellent field-plate dimensional control and ease of processing. The stepped gate can be designed to accommodate trade-offs between capacitance, gate charge, speed, and breakdown voltage for various power switching and/or RF applications. A stepped field plate gate according to this disclosure has been reduced to practice and combined with ohmic contact regrowth, an ultra-short gate, and enhancement-mode scaled epitaxial layers to demonstrate a high-speed switch with low on-resistance and a breakdown voltage greater than 200 volts (V).

The fabrication method described in this disclosure allows realization of a single-metallization gate with multiple field-plate steps. The continuous stepped field-plate gate dimensions can be more easily scaled than prior art discontinuous multiple-field plate structures and should result in a more uniform electric field profile.

The stepped gate field plate allows engineering of the electric field in the gate-drain region of a GaN HFET device. Through modification of the dielectric layer thicknesses and the field plate dimensions, the electric field can be engineered to maximize breakdown voltage, minimize charge trapping, and manage parasitic capacitances for optimum device performance. Prior art field-plated GaN devices utilized either a single field plate or multiple field-plates separated by supporting dielectric layers. The dimensions of the stepped field-plate gate in this disclosure are more easily scaled than in previous multiple field-plate structures, in which both the distance of the field plate from the epitaxial surface and the spacing between adjacent field-plates was defined by the thickness of the deposited dielectric layers.

FIG. 1A shows a cross-sectional schematic of a multiple stepped field-plate GaN FET in accordance with the present disclosure.

In one embodiment, the FET has a substrate 12, which may be SiC, sapphire, or GaN, a buffer layer 14, which may be AlGaN or GaN on top of the substrate 12, a channel layer 16, which may GaN or InN and which may be vertically scaled DHFET epi, on top of the buffer layer 14, and a barrier layer 18, which may be AlN or AlGaN, on top of the channel layer 16. A source 20 and a drain 22, which may be n+ GaN, are in contact with the channel layer 16. An in-situ SiN layer 24 may be on top of the barrier layer 18.

A stepped field plate gate 32, which may be Au, Ti Pt, Ni or Al, is in a stepped opening in passivation layers 26, 28 and 30, which may be SiN or SiO$_2$. A Pt or Ni seed layer 34 may be between the stepped field plate gate 32 and the passivation layers 26, 28 and 30.

In one embodiment, the seed layer 34 may be in contact with the barrier layer 18, which is the case for a Schottky gate device. In another embodiment, as shown in FIG. 1A, the seed layer 34 may be insulated from the barrier layer 18, for example, by gate dielectric layer 36, which is the case for a metal insulated semiconductor device.

FIG. 1B shows a cross-sectional transmission electron microscopy (TEM) image of a multiple stepped field-plate gate GaN FET, fabricated in accordance with the disclosure. The stepped gate in FIG. 1B shows three field plates, labeled FP1, FP2, and FP3; however, there is no separation between the field plates, which are all part of one structure.

A preferred embodiment incorporates features that reduce parasitics and/or improve high-speed operation of the device, such as n+ GaN regrown ohmic contacts, a deep submicron 100 nm gate foot 40, and a vertically-scaled AlN/GaN/AlGaN DHFET epitaxial structure for providing an E-mode operation.

FIG. 2 shows a process flow used to fabricate the stepped field-plate gate 32 of the present disclosure. In step 1 of FIG. 2, epitaxial layers are grown on the substrate 12 for the buffer layer 14, the channel layer 16, and the barrier layer 18. Then in step 2 of FIG. 2 a dielectric mask layer 50 is deposited. Then in step 3 of FIG. 2, the barrier layer 18 is etched away in the ohmic contact regions of the device using photolithography and reactive ion etching (RIE). Then in step 4 of FIG. 2, ohmic regrowth is performed by regrowing n+ GaN by molecular beam epitaxy (MBE) to form low-resistance ohmic contacts 52 and 54 for the source 20 and drain 22 to the 2DEG. A polycrystalline layer 56 forms on the dielectric mask layer 50. Then the dielectric mask layer 50 is removed in step 5 of FIG. 2.

Next in step 6 of FIG. 2, a first passivation layer 26, which may be SiN or $SiO_2$, is deposited on the barrier layer 18 and the ohmic contacts 52 and 54 by plasma-enhanced chemical vapor deposition.

Then in step 7 of FIG. 2, device isolation is achieved by etching to form a mesa, and implanting ions in the etched regions 57 surrounding the mesa for further device isolation, as shown in step 8 of FIG. 2.

The field-plate dielectric stack is then deposited, consisting of alternating layers of plasma-enhanced chemical vapor deposition (PECVD) of SiN or $SiO_2$ for the passivation layers and atomic layer disposition (ALD) of $Al_2O_3$ for etch-stop layers. In step 9 of FIG. 2 an etch stop layer 58 is deposited. Next in step 10 a second passivation layer 28, is deposited on the etch stop layer 58. Then, as shown in step 11 of FIG. 2 an etch stop layer 60 is deposited over the second passivation layer 28, and then a third passivation layer 30 is deposited on the etch stop layer 60.

Then as shown in step 12 of FIG. 2 lithography is used to apply resist layers 63, 64, and metal is evaporated through the opening in the resist layers 63, 64 to form a field plate mask 62, which may be metal, to define the source-side 62 of the stepped field plate gate 32, eliminating the need for realignment during field-plate processing.

Then the field-plates are formed using optical lithography and CF4-based reactive ion etching (RIE) of the SiN, which selectively stops at the $Al_2O_3$ etch-stop layers due to differences in the etch rates of the two materials with the chosen etch chemistry. In step 13 of FIG. 2 a mask 66 is formed, and then in step 14 of FIG. 2 RIE is used to remove a portion of the third passivation layer 30. The RIE etch stops at the $Al_2O_3$ etch-stop layer 60 due to differences in the etch rates of the two materials. In step 15 of FIG. 2 a mask 70 is formed, and then in step 16 of FIG. 2 RIE is used to remove a portion of the second passivation layer 28. The RIE etch stops at the $Al_2O_3$ etch-stop layer 58 due to differences in the etch rates of the two materials.

Then in step 17 of FIG. 2 lithography is used to apply a mask 72 to define a gate foot 74. The gate foot 74 is etched through the opening in mask 72 using RIE plasma etching, etching a portion of the first passivation layer 26, as shown in step 18 of FIG. 2.

Then, as shown in step 19 of FIG. 2, a platinum (Pt) seed layer 34 is deposited by atomic layer deposition (ALD). Next, as shown in step 20 of FIG. 2, lithography is used to apply a mask 76 to define the third field-plate (FP3) 31, as shown in FIG. 1B, and the gate metal for the stepped field plate gate 32 and the gate foot 74 is plated. Then as shown in step 21 of FIG. 2, the mask 76 is removed.

Next, as shown in step 22 of FIG. 2, the portion of the platinum (Pt) seed layer 34 that is not under the stepped field plate gate 32 is removed by ion milling. Then, as shown in step 23 a SiN layer 80 is deposited. Next, as shown in step 24 of FIG. 2, the SiN layer 80 and the first, second and third passivation layers 26, 28 and 30 are selectively etched to expose ohmic contacts 52 and 54 and ohmic contacts 66 connected to the ohmic contacts 52 and 54 are deposited. Then, as shown in step 25 of FIG. 2, lithography is used to define a mask 82 for source 20 and drain 22 metal. Next, as shown in step 26 of FIG. 2, overlay metal 84 is deposited to form the source 20 and drain 22 contacts.

The preferred embodiment incorporates three field plates in the gate; however, fewer or more field plates may be utilized for engineering of the electric field in the gate-drain region of the device.

Figures 3A, 3B:
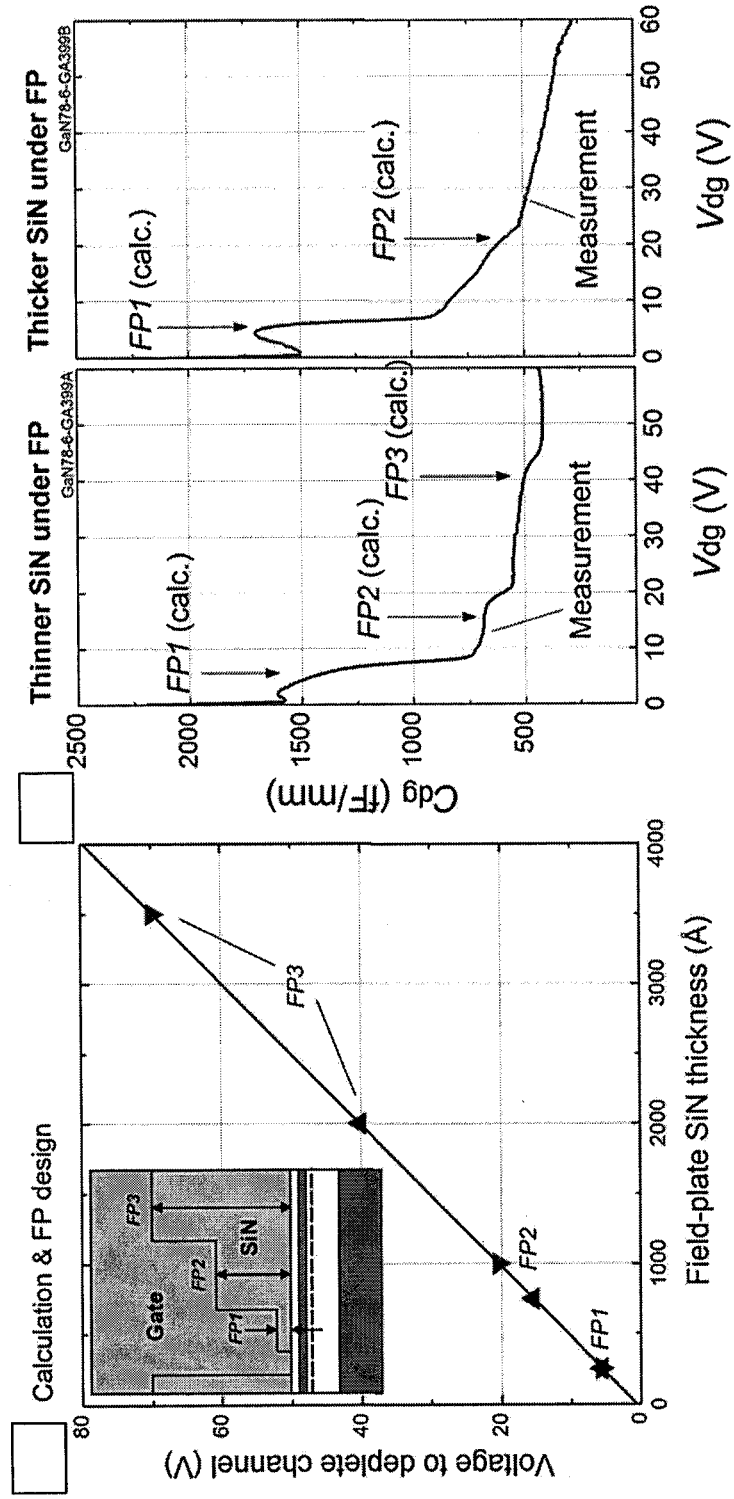
FIG. 3A shows the calculated voltage to deplete the channel for varying thicknesses of field-plate of SiN based on simple capacitance considerations.
FIG. 3B shows measured data for two different field plate designs on the same wafer in accordance with the present disclosure.

Devices with stepped field plate gates were fabricated with varying field-plate dimensions and tested. FIG. 3A shows the voltage required to fully deplete the channel under the field plate depending on the thicknesses of the passivation layers 26, 28 and 30, which was calculated using simple capacitance considerations. FIG. 3B shows the measured capacitance data of two different fabricated samples with different field plate thicknesses. Steps in the drain-gate capacitance (Cdg) were observed at voltages close to the calculated values for the given passivation layer thicknesses, demonstrating good control of field plate design.

Figure 4:
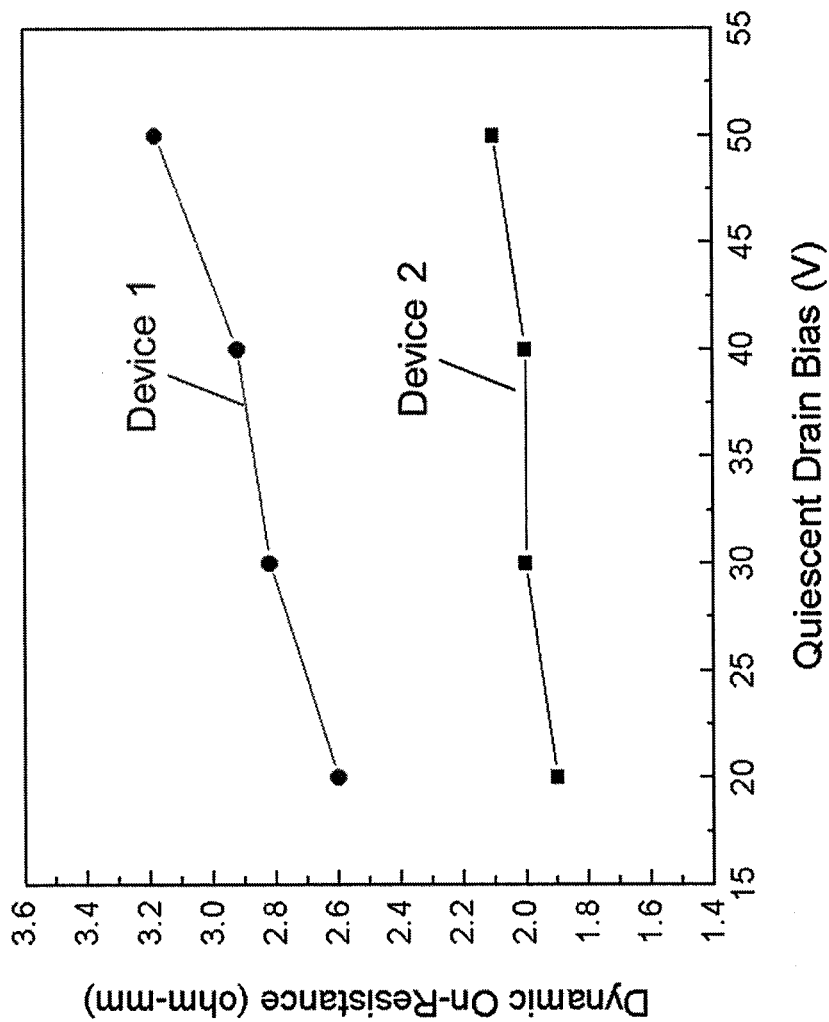
FIG. 4 shows the measured dynamic on-resistance for two different field-plate geometries fabricated on the same wafer in accordance with the present disclosure.

FIG. 4 shows the measured dynamic on-resistance for FETs with a gate-drain spacing of 2 um fabricated on the same wafer with different lateral field plate dimensions. The dynamic on-resistance was very low (~2 ohm-mm) for drain biases of up to 50V for the larger field-plate design, shown as Device 2 in FIG. 4, while it was higher for the FET with smaller field-plates, shown as Device 1 in FIG. 4, and increased with increasing drain bias. The low dynamic on-resistance and dependence on field-plate design demonstrates the effectiveness of the stepped field-plate gate for electric field mitigation.

The two different field-plate geometries were fabricated on the same wafer. Lateral field plate dimensions for Device 1 were 0.2, 0.2, and 0.4 um for FP1, FP2, and FP3, respectively. Field plate dimensions for Device 2 were 0.4 um, 0.5 um, and 0.7 um for FP1, FP2, and FP3, respectively.

Figure 5:
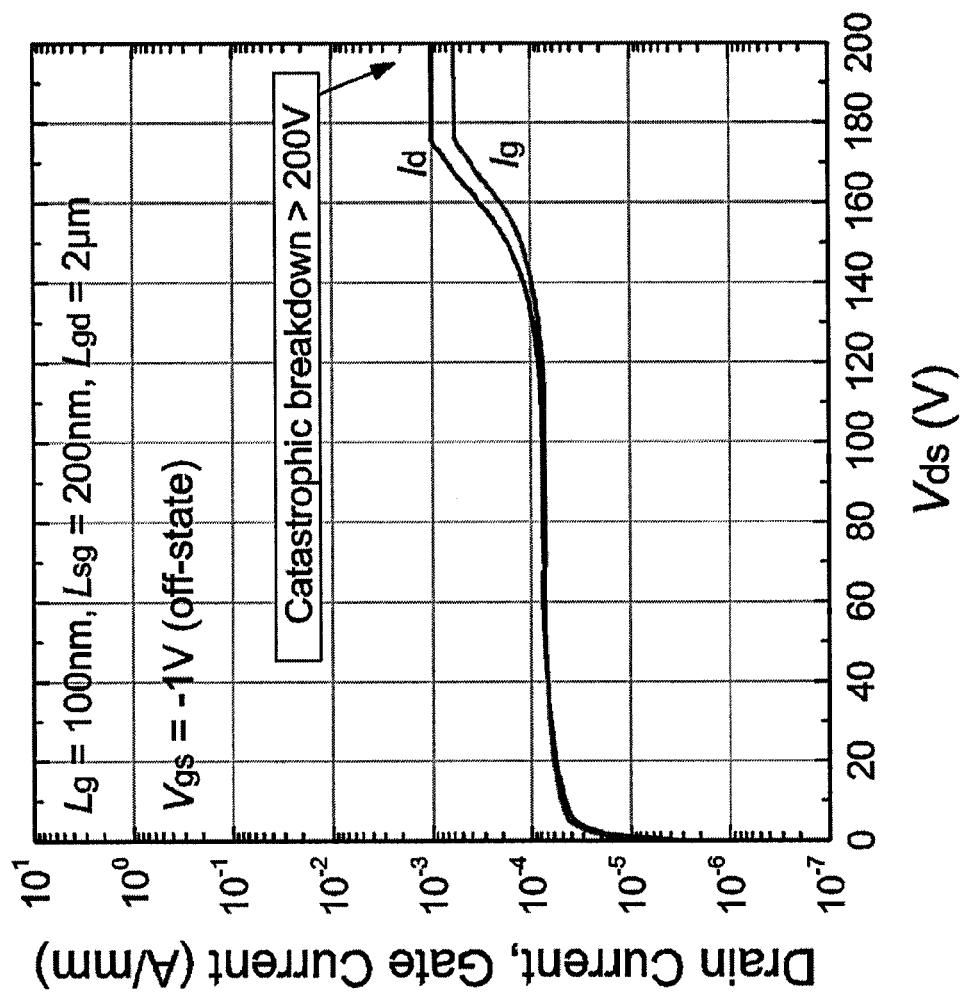
FIG. 5 shows the three-terminal breakdown characteristics of a stepped field-plate FET with a gate-drain spacing of 2 μm in accordance with the present disclosure.

FIG. 5 shows the three-terminal breakdown characteristics of a stepped field-plate FET with a gate-drain spacing of 2 μm. The catastrophic breakdown voltage was measured to be greater than 200 V. The off-state gate and drain currents were less than $10^{-4}$ A/mm for a $V_{ds}$ up to 130V and were limited by gate leakage. The high gate leakage was due to the use of a Schottky gate contact and would be mitigated with the implementation of a gate dielectric. The catastrophic breakdown voltage corresponds to an average electric field in the gate-drain region of the device of greater than 100V/μm, which is comparable to state-of-the-art GaN high voltage devices and demonstrates the effectiveness of the stepped field plate.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of making a stepped field gate for a field effect transistor (FET) comprising:
   forming a first set of layers having a first passivation layer on a barrier layer of the FET and a first etch stop layer over the first passivation layer;
   forming at least one additional set of layers over the first etch stop layer, wherein additional sets of layers each have a passivation layer and an etch stop layer on the passivation layer;
   forming a top passivation layer over the additional sets of layers;
   forming a field plate mask on the top passivation layer to define a source side of a stepped field-plate gate;
   successively removing portions of the top passivation layer and of each set of layers using lithography and reactive ion etching to form stepped passivation layers, wherein the field plate mask defines a boundary for the etching on the source side;
   applying a mask having an opening defining an extent of the stepped field-plate gate; and
   forming the stepped field-plate gate by plating through the opening in the mask.

2. The method of claim 1 further comprising:
   depositing a seed layer through the opening in the mask by atomic layer deposition (ALD) before forming the stepped field-plate gate.

3. The method of claim 1 further comprising:
   growing a buffer layer on a substrate, a channel layer on the buffer layer, and the barrier layer on the channel layer;
   forming first and second ohmic contacts to the channel layer for a source and a drain; and
   forming the first passivation layer on the barrier layer and the ohmic contacts; and
   etching portions of the first passivation layer, the first and second ohmic contacts, the channel layer and the buffer layer to form a mesa for device isolation.

4. The method of claim 1 wherein each the first passivation layer comprises SiN or $SiO_2$.

5. The method of claim 1 wherein each etch stop layer comprises $Al_2O_3$ an formed by atomic layer deposition.

6. The method of claim 2 further comprising:
   removing a portion of the seed layer that is not under the stepped field-plate gate by ion milling.

7. The method of claim 3 wherein the step of forming first and second ohmic contacts to the channel layer for a source and a drain comprises:
   depositing a dielectric mask layer on the barrier layer;
   etching exposed portions of the barrier layer using reactive ion etching (RIE); and
   regrowing n+ GaN by molecular beam epitaxy (MBE) to form low-resistance ohmic contacts for the source and drain.

8. The method of claim 2 wherein a portion of the seed layer is formed to be in contact with the barrier layer to form a Schottky gate device.

9. The method of claim 2 wherein the seed layer is insulated from the barrier layer.

10. The method of claim 1 wherein the stepped field-plate gate comprises Au, Ti Pt, Ni or Al.

11. The method of claim 2 wherein the seed layer comprises Pt or Ni.

12. The method of claim 1 further comprising removing the mask.

13. The method of claim 3 further comprising implanting ions in etched regions surrounding the mesa for further device isolation.

14. The method of claim 1:
   wherein successively removing portions of the top passivation layer and of each set of layers using lithography and reactive ion etching to form stepped passivation layers further comprises forming a gate foot recess; and
   wherein forming the stepped field-plate gate by plating through the opening in the mask further comprises plating through the opening in the mask to form a gate foot in the gate foot recess.

15. The method of claim 3 further comprising:
   etching to expose the first and second ohmic contacts and depositing a third ohmic contact on the first ohmic contact, and a fourth ohmic contact on the second ohmic contact; and
   depositing overlay metal on the third and fourth contacts to form a source and a drain contact, respectively.

16. The method of claim 1 wherein the field plate mask comprises metal.

* * * * *